United States Patent [19]

Hermann et al.

[11] 4,450,378
[45] May 22, 1984

[54] ZT-CUT PIEZO-ELECTRIC RESONATOR

[75] Inventors: Jean Hermann, Neuchatel; Claude Bourgeois, Bole, both of Switzerland

[73] Assignee: Centre Electronique Horloger S.A., Switzerland

[21] Appl. No.: 460,910

[22] Filed: Jan. 25, 1983

[30] Foreign Application Priority Data

Feb. 16, 1983 [FR] France ............................ 82 02497

[51] Int. Cl.³ ......................................... H01L 41/08
[52] U.S. Cl. ................................. 310/361; 310/367; 310/368
[58] Field of Search ................... 310/361, 367, 368

[56] References Cited

U.S. PATENT DOCUMENTS

| 2,301,269 | 11/1942 | Gerber | 310/367 X |
| 3,245,012 | 4/1966 | Schofer | 310/367 X |
| 4,313,071 | 1/1982 | Hermann et al. | 310/361 |
| 4,368,402 | 1/1983 | Torii et al. | 310/367 |

FOREIGN PATENT DOCUMENTS

| 52-39391 | 3/1977 | Japan | 310/367 |
| 52-48990 | 4/1977 | Japan | 310/367 |
| 52-53690 | 4/1977 | Japan | 310/367 |

Primary Examiner—Mark O. Budd
Attorney, Agent, or Firm—Parkhurst & Oliff

[57] ABSTRACT

A ZT-cut quartz crystal resonator comprises two thin rectangular plates connected together by at least one resonant arm which itself is connected to a support zone by a linking bar. A pair of electrodes is provided on the quartz resonator for receiving alternating electrical signals of opposite polarity for effecting in-phase contour-mode vibration of the plates while making the arms to vibrate in opposite phase to the plates.

11 Claims, 10 Drawing Figures

U.S. Patent May 22, 1984 Sheet 2 of 3 4,450,378
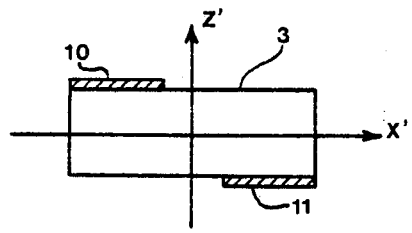
FIG.3.b
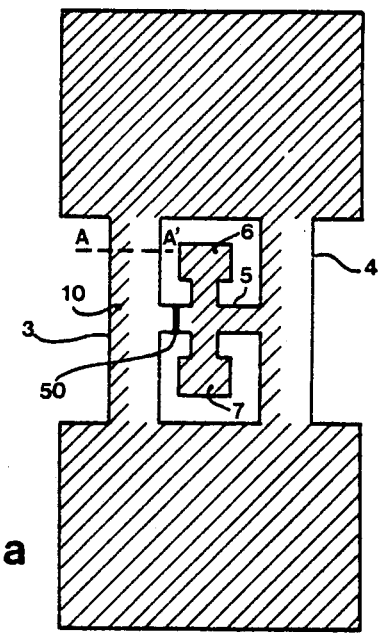
FIG.3.a
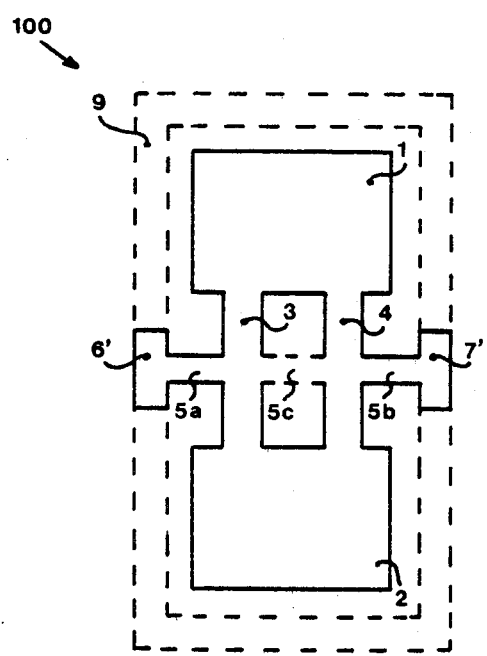
FIG.4
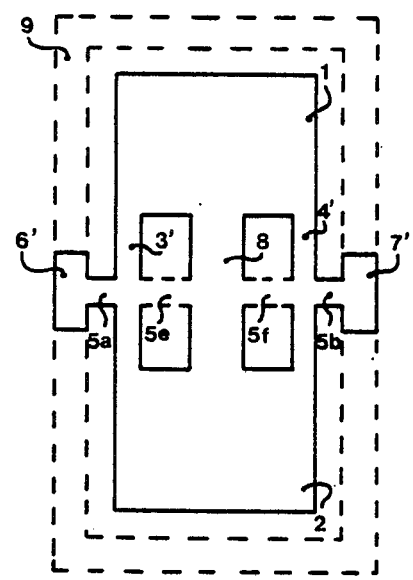
FIG.5

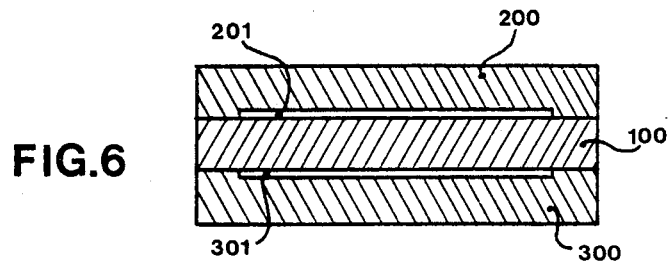
FIG.6
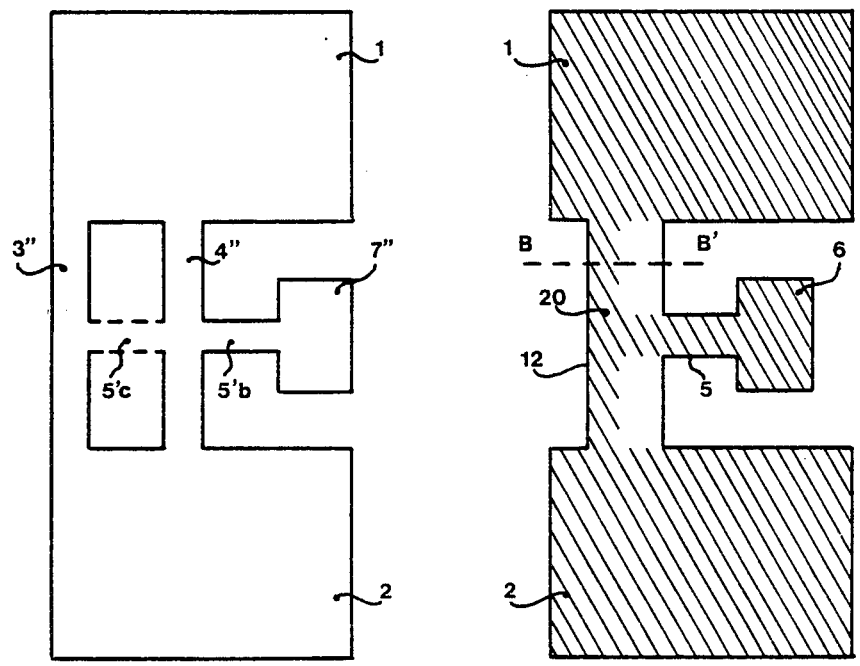
FIG.7    FIG.8.a
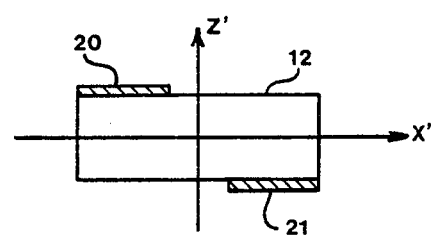
FIG.8.b

ZT-CUT PIEZO-ELECTRIC RESONATOR

BACKGROUND OF THE INVENTION

The present invention concerns a clamped resonator fabricated from a quartz substrate having a ZT-cut.

A ZT-cut piezo-electric resonator, to which the present invention applies, has been described in U.S. Pat. No. 4,313,071. It is fabricated from a thin rectangular quartz plate whose length, width and thickness are orientated along axes X', Y' and Z' respectively. The Z'-axis is situated in the plane containing the electrical, X, and optical, Z, crystal axes and forms an angle, $\phi$, with the Z-axis such that $16° < \phi < 36°$ and the Y'-axis forms an angle, $\theta$, with the mechanical Y-axis such that $10° < \theta < 30°$. Such a resonator vibrates in a contour mode and possesses excellent temperature characteristics. In particular, the first-order temperature coefficient is zero and does not depend critically on the plate's dimensional ratio w/l and the higher-order temperature coefficients are very small. Until now, such a resonator had to be mounted with suspension wires fixed at neutral points. Such a construction is delicate and leads to limited shock resistance as well as a high final cost.

Available on the market are quartz crystals with different cuts, among which the GT-cut is that which possesses the most favorable temperature characteristics. A GT-cut resonator consists of a thin rectangular plate and vibrates in a contour mode. A resonator of this type, fabricated in a way which allowed it to be easily mounted, has been described at the 34th Annual Frequency Control Symposium, USA ERADCOM, Ft. Monmouth, NJ 07703 in May 1980 under the title: "New frequency temperature characteristics of miniaturized GT-cut quartz resonators". The described resonator consists of a thin rectangular plate on whose sides supporting portions have been fabricated. These supporting portions are complex and add to the inherent critical nature of the temperature characteristics of a GT-cut quartz crystal. In effect, the temperature characteristics depend in a critical way on the plate's dimensional ratio and also on the size of the supporting portions. As these dimensions are very small (typically 80 μm for the width of the support), fabrication tolerances necessarily imply an individual adjustment of the temperature characteristics for each resonator, which increases the final cost.

SUMMARY OF THE INVENTION

An object of the present invention is a resonator having good temperature characteristics over a wide temperature range and possessing high shock resistance.

A further object of the invention is a resonator which can be mass-produced and which does not require an adjustment of its temperature characteristics.

Another object of the invention is a resonator which can be easily fabricated by using photolithographic processes.

A further object of the invention is a resonator which can be easily mounted in a case.

According to one embodiment of the invention, the resonator is fabricated from a ZT-cut substrate and consists of two rectangular plates joined by at least one resonant arm which itself is joined to a support zone.

BRIEF DESCRIPTION OF THE INVENTION

The invention will now be described by way of example with reference to the accompanying drawings in which.

Figure 2:
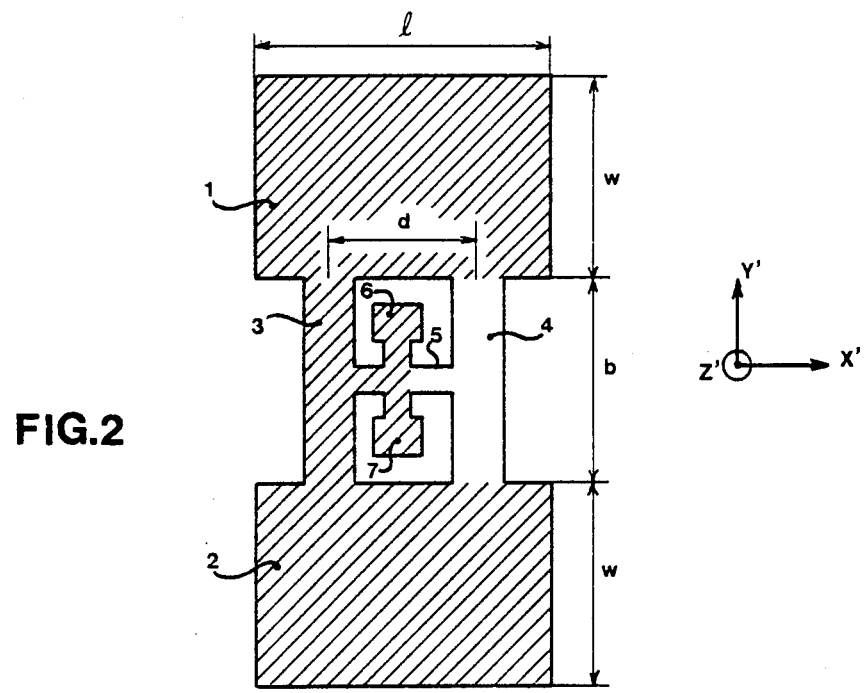
FIG. 2 shows a first form of the invention.

FIGS. 3.a and 3.b show another electrode geometry for the form shown in FIG. 2;

FIGS. 4 and 5 show two other forms of the invention;

FIG. 6 shows an example of a resonator mounted in a case;

FIGS. 7 and 8.a show two other forms of the invention; and

FIG. 8.b shows a cross-sectional view of the resonant arm of FIG. 8.a.

DETAILED DESCRIPTION OF THE INVENTION

Figure 1:
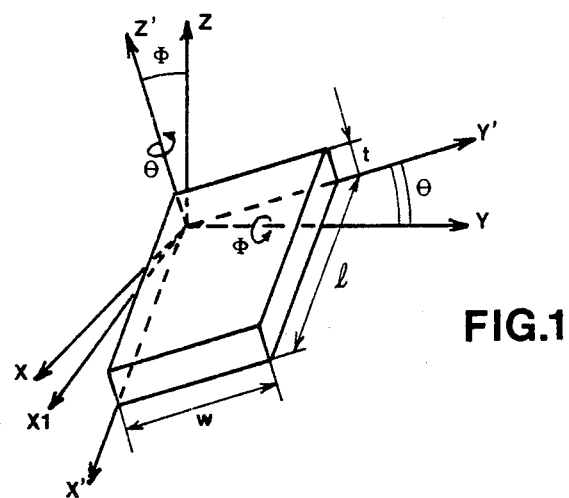
FIG. 1 is a perspective view showing the orientation of a ZT-cut resonator.

FIG. 1 shows a ZT-cut resonator such as described in the aforementioned U.S. Patent. The ZT-cut plate is obtained from a Z-cut substrate, i.e. a substrate having for its normal the optical axis Z of the quartz crystal. A first rotation of angle $\phi$ about the mechanical axis Y brings the optical axis Z into Z' and the electrical axis X into X1. A second rotation of angle $\theta$ about the Z' axis brings the axis X1 into X' and the axis Y into Y'. The directions X', Y' and Z' correspond respectively to the length l, the width w and the thickness t of the ZT-cut plate. In accordance with the IRE standard, such a cut is noted: (ZXwt)$\phi$, $\theta$. The angles $\phi$ and $\theta$ are such that $\phi$ lies between 16° and 36° and $\theta$ lies between 10° and 30° and the dimensional ratio w/l is between 0.5 and 0.8. Nevertheless, best results have been obtained with a resonator whose values of $\phi$, $\theta$ and w/l are 26°, 20° and about ⅔ respectively.

FIG. 2 shows a first form of the resonator in accordance with the principles of the present invention. The resonator consists of two plates 1 and 2 joined by two resonant arms 3 and 4. The arms are said to be resonant because they vibrate in a way such that constraints are negligible at the places where arms and plates join. A linking bar 5 connects the resonant arms to the support zones 6 and 7. The resonator dimensions correspond to the following parameters. The width w of each plate determines the frequency, the frequency constant being approximately 2823 kHz mm. The ratio of the width to the length, namely w/l, controls the second-order temperature coefficient of the frequency parameter; it should lie between 0.5 and 0.9, the optimum being attained when w/l is approximately equal to 0.7. The length b of the resonant arms 3 and 4 should be chosen so as to annul any contraints at the separating line between arms and plate; it should be longer than the width w such that the ratio b/w lies between 1 and 1.1. However, if small contraints can be tolerated at the said separating line, the ratio b/w can then lie between 0.7 and 1.4. The distance d between resonant arm centres should be chosen so as to annul any variation, by the length b of the resonant arms, of the first order temperature coefficient of the frequency parameter; it should be such that the ratio of this distance to the length of each plate, namely d/l, lies between 0.3 and 0.7, an optimum being attained when d/l is approximately equal to 0.5. The width of the linking bar 5 is not critical; however, it should be neither too small in order to ensure good resonator shock resistance nor too large in order not to influence too much the resonant frequency of the arms 3 and 4. In practice, the width of the linking bar will be smaller than its length. The resonator thickness t is in principle a free parameter as for all contour mode resonators; nevertheless, it should be chosen so as to avoid any coupling with vibration modes outside the plane and can be between 25 and 250 μm, a thickness of 150 μm is a good compromise.

FIG. 2 shows a first electrode arrangement; the upper electrode is represented by the hatched area while the lower electrode (not shown) is arranged symetrically to the first electrode with respect to the centre of the resonator.

FIGS. 3.a and 3.b show still another possible electrode arrangement. As indicated in the figures, the upper 10 and lower 11 electrodes are each symetrically arranged with respect to the centre of the resonator. Such an electrode arrangement suppresses coupling of the fundamental extension-mode vibration in the Y' direction, FIG. 3.a shows still another difference with respect to the resonator in FIG. 2. In effect, according to FIG. 3.a, only the resonant arm 4 is connected to the support zones 6 and 7 by the linking bar 5, the gap 50 freeing the resonant arm 3. It is equally possible, with the resonators in FIGS. 2 and 3.a, to provide only one support zone 6 or 7.

A resonator, such as described above, functions as follows. The vibration mode used is an extension mode in the Y' direction. Each plate 1 or 2 vibrates like the rectangular ZT-cut resonator described in the aforesaid Patent, the movements of the two plates being in phase. The arms 3 and 4 also resonate but they vibrate (extension in the Y' direction) in opposite phase to the plates 1 and 2; their length is chosen in such a way as to perturb the least possible the ideal movement of the plates so that these may be considered as quasi-free resonators. The linking bar 5 is the centre of a forced oscillation whose amplitude diminishes so rapidly with distance away from the zone of contact with the arm as to be negligible in the region of the support zones 6 and 7.

FIGS. 4 and 5 show variants of the resonator of the invention in which the support zones are arranged outside the resonator. In the two figures, equivalent parts are referenced with the same number. The resonator in FIG. 4 is identical to that in FIG. 2 with the exception of the position of the support zones 6' and 7' and of the linking bar which consists of three parts 5a, 5b and 5c which connect respectively the support zone 6' to the resonant arm 3, the resonant arm 4 to the support zone 7' and the two resonant arms 3 and 4 to each other. The support zones can be part of a frame 9 (indicated by dashed lines) surrounding the actual resonator and facilitating its packaging as will be seen later. Part 5c of the linking bar is not indispensable and can be left out. The resonator in FIG. 5 has three resonant arms of which the two outside ones 3' and 4' have a width about two times smaller than that of the central arm 8. The support zones 6' and 7' can also be part of a frame 9. The linking bar consists of four parts 5a, 5b, 5e and 5f, the two central parts 5e and 5f can be left out.

FIG. 6 shows an example of packaging for resonators having external support zones. The resonator 100, identical to the resonator in FIG. 4 or 5, is mounted between two plates 200 and 300 which each have a cavity 201 or 301 in the region corresponding to the active part of the resonator. The two plates 200 and 300 are fixed, for example with a glue, onto the frame of the resonator and so form a case. These plates can be made of a ZT-cut quartz crystal, of a metal whose expansion coefficient is close to that of quartz or of any other adequate material such as, for example, a ceramic. In the case of metallic plates, these make the electrical connection between the resonator and the associated oscillator circuit. On the other hand, in the case of isolating plates, these will be metallized in an appropriate way and the connection between plates and resonator could be made by using a conducting glue.

FIGS. 7 and 8 show two asymmetrical variants of resonators according to the invention. The resonator in FIG. 7 has two resonant arms 3'' and 4'' connected to only one support zone 7'' by a linking bar having two parts 5'b and 5'c, the part 5'c possibly being able to be left out. The resonator in FIG. 8.a has only one resonant arm 12 connected to a support zone 6 by a linking bar 5. The hatched portion 20 indicates the upper electrode and the cross-sectional view, of the plane BB', in FIG. 8.b shows the arrangement of the lower electrode 21 in the region of the arm 12.

The resonator of the present invention can be fabricated by using chemical milling. In effect, the normal to a ZT-cut quartz substrate makes an angle smaller than 27° with the optical axis Z of the crystal which is the privileged direction of attack in the crystal. Thus, on the same substrate, several resonators can be cut out simultaneously, allowing mass-production. Fabrication cost is reduced even further by the facts that no adjustment of the temperature coefficients is required and that the packaging of a resonator according to the invention is easy.

Although exemplary embodiments of the invention have been shown and described, it should be understood that many modifications can be made without departing from the spirit and scope of the invention. Accordingly, the invention is not limited by the foregoing description but only by the claims appended hereto.

What is claimed is:

1. A clamped piezoelectric resonator fabricated in a ZT-cut quartz substrate comprising two thin rectangular plates connected together by at least one resonant arm, said resonant arm being coupled to at least one support zone and said resonant arm having a resonant frequency which is substantially the same as the resonant frequency of said plates.

2. A clamped piezoelectric resonator fabricated in a ZT-cut quartz substrate comprising two thin rectangular plates connected together by two resonant arms, each of said resonant arms being coupled to one of two support zones by a linking bar.

3. Resonator according to claim 2, wherein the said zones are arranged between the said resonant arms.

4. Resonator according to claim 2, wherein the said support zones are arranged outside the resonator.

5. Resonator according to claim 4, wherein the said support zones form part of a frame surrounding the said resonator.

6. A clamped piezoelectric resonator fabricated in a ZT-cut quartz substrate comprising two thin rectangular plates connected together by two resonant arms, one of said resonant arms being connected to a support zone.

7. A clamped piezoelectric resonator fabricated in a ZT-cut quartz substrate comprising two thin rectangular plates connected together by three resonant arms wherein one arm is positioned between two outside arms and said two outside arms are each coupled to a support zone by a linking bar.

8. A piezoelectric resonator comprising:
a piezoelectric substrate configured to form two resonating portions coupled to one another by at least one resonant arm having a resonant frequency substantially equal to the resonant frequency of said resonator portions;
a support zone; and
means coupling said at least one resonant arm to said support zone.

9. The piezoelectric resonator of claim 8 wherein said resonators are formed as two thin rectangular plates in a ZT-cut quartz substrate.

10. The resonator of claim 9 wherein the ratio of the length of said at least one resonant arm to the width of said rectangular plates lies between 0.7 and 1.4.

11. The resonator of claim 9 wherein the ratio of the length of said at least one resonant arm to the width of said rectangular plates lies between 1 and 1.1.

* * * * *